(12) United States Patent
Birk et al.

(10) Patent No.: US 11,262,465 B2
(45) Date of Patent: Mar. 1, 2022

(54) METHOD FOR EVALUATING A SINGLE-PHOTON DETECTOR SIGNAL

(71) Applicant: Leica Microsystems CMS GmbH, Wetzlar (DE)

(72) Inventors: Holger Birk, Meckesheim (DE); Bernd Widzgowski, Dossenheim (DE)

(73) Assignee: LEICA MICROSYSTEMS CMS GMBH, Wetzlar (DE)

( * ) Notice: Subject to any disclaimer, the term of this patent is extended or adjusted under 35 U.S.C. 154(b) by 200 days.

(21) Appl. No.: 16/581,873

(22) Filed: Sep. 25, 2019

(65) Prior Publication Data
US 2020/0103538 A1    Apr. 2, 2020

(30) Foreign Application Priority Data

Sep. 28, 2018   (DE) .................... 10 2018 124 123.2

(51) Int. Cl.
| | |
|---|---|
| *G01T 3/00* | (2006.01) |
| *G01T 1/20* | (2006.01) |
| *H01L 27/30* | (2006.01) |
| *G02B 21/00* | (2006.01) |

(52) U.S. Cl.
CPC ............ *G01T 3/006* (2013.01); *G01T 1/2018* (2013.01); *H01L 27/308* (2013.01); *G02B 21/0024* (2013.01)

(58) Field of Classification Search
CPC ........ G01J 1/42; G01J 1/44; G01J 1/46; G01J 2001/442; G01N 21/6458; G01T 3/006; G02B 21/0024; G06K 9/00523; H01L 27/208
See application file for complete search history.

(56) References Cited

U.S. PATENT DOCUMENTS

| | | | |
|---|---|---|---|
| 6,023,053 | A | 2/2000 | Nakayama et al. |
| 6,211,664 | B1 | 4/2001 | Bonnefoy et al. |
| 6,944,220 | B2 | 9/2005 | Neubauer |
| 8,797,522 | B2 | 8/2014 | Akihiro et al. |

(Continued)

FOREIGN PATENT DOCUMENTS

| | | |
|---|---|---|
| CN | 1236891 A | 12/1999 |
| CN | 1411628 A | 4/2003 |

(Continued)

OTHER PUBLICATIONS

Chen, Xiuliang et al. "Low-noise high-speed InGaAs/InP-based single-photon detector," Mar. 22, 2010, Optics Express 7010, vol. 18, No. 7.

(Continued)

*Primary Examiner* — Mark R Gaworecki
(74) *Attorney, Agent, or Firm* — Leydig, Voit & Mayer, Ltd.

(57) ABSTRACT

A method for evaluating a single-photon detector signal includes duplicating the single-photon detector signal into a first and a second signal. The first signal is processed and the second signal is either not processed or is processed in a manner different from the first signal. A differential signal is formed between the unprocessed or differently processed second signal and the processed first signal. The differential signal is evaluated to determine pulse events.

23 Claims, 7 Drawing Sheets

(56) References Cited

U.S. PATENT DOCUMENTS

| | | | |
|---|---|---|---|
| 8,841,596 B2* | 9/2014 | Thomas | G01J 1/44 250/214 R |
| 10,660,589 B2 | 5/2020 | Roessl | |
| 2010/0213353 A1 | 8/2010 | Cierickx | |
| 2011/0108712 A1 | 5/2011 | Thomas et al. | |
| 2011/0210235 A1 | 9/2011 | Dierickx | |
| 2013/0032699 A1 | 2/2013 | Widzgowski | |
| 2013/0099100 A1 | 4/2013 | Pavlov | |
| 2014/0027607 A1* | 1/2014 | Mordarski | H01L 31/02027 250/206 |
| 2016/0377721 A1 | 12/2016 | Lardin et al. | |
| 2017/0187721 A1 | 6/2017 | Raynor | |
| 2018/0259629 A1 | 9/2018 | Oohata et al. | |

FOREIGN PATENT DOCUMENTS

| | | |
|---|---|---|
| CN | 107003421 A | 8/2017 |
| DE | 112011102595 T5 | 5/2013 |
| JP | 2011033760 A | 2/2011 |
| JP | 2013033044 A | 2/2013 |
| JP | 2013510305 A | 3/2013 |
| JP | 2018-520346 A | 7/2018 |
| WO | WO 2017042993 A1 | 3/2017 |

OTHER PUBLICATIONS

Liang, Yan et al. "High-Speed Single-Photon Detection with Avalanche Photodiodes in the Near Infrared," Oct. 7, 2015, InTech.

Becker, Wolfgang et al. "FRET measurements by TCSPC laser scanning microscopy," Nov. 2, 2001, Proc. SPIE 4431, Photon Migration, Optical Coherence Tomography, and Microscopy.

Setsu, Jyo and Inoue, Kyo, "Reduction of After-Pulse in APD Single-Photon Detector with Low-Pass filter", Abstracts for The 61st Japan Society of Applied Physics Spring Meeting, Mar. 3, 2014, p. 05-030.

Acerbi, Fabio et al. "High Sensitivity Photodetector for Photon-Counting Applications," In: "Photon Counting—Fundamentals and Applications," Mar. 21, 2018, InTech, XP055668360.

Anonymous, "matlab—Is a high-passed signal the same as a signal minus a low-passed signal?" Signal Processing Stack Exchange, Mar. 6, 2015, XP055668691.

Anonymous, "filters—Is subtraction a common method for efficient filtering?," Signal Processing Stack Exchange, Oct. 27, 2016, XP055668689.

Aasvik, Mads, "Arduino Tutorial: Simple High-pass, Band-pass and Band-stop Filtering," URL: https://www.norwegiancreations.com/2016/03/arduino-tutorial-simple-high-pass-band-pass-and-band-stop-filtering/, Mar. 10, 2016.

Aasvik, Mads, "Tutorial: Potentiometers with Arduino and Filtering," URL: https://www. norweg iancreations.com/2015/1 0/tutorial-potentiometers-with-arduino-and-filtering/, Oct. 28, 2015.

* cited by examiner

METHOD FOR EVALUATING A SINGLE-PHOTON DETECTOR SIGNAL

CROSS-REFERENCE TO PRIOR APPLICATIONS

Priority is claimed to German Patent Application No. DE 10 2018 124 123.2, filed on Sep. 28, 2018, the entire disclosure of which is hereby incorporated by reference herein.

FIELD

The present invention relates to a method for evaluating a single-photon detector signal and to an arrangement, to a computer unit and to a computer program for performing said method.

BACKGROUND

For example in confocal microscopy, light detectors that are as sensitive as possible are used in order to record the fluorescent light emanating from the sample with a signal-to-noise ratio that is as good as possible and quantitatively as accurately as possible. Various types of photomultipliers are suitable for this purpose. It is in particular desirable also to use semiconductor photomultipliers (SPM) such as silicon photomultipliers (SiPM) for this purpose, since these offer advantages in terms of sensitivity, temporal resolution and robustness at comparatively low costs.

Figure 1:
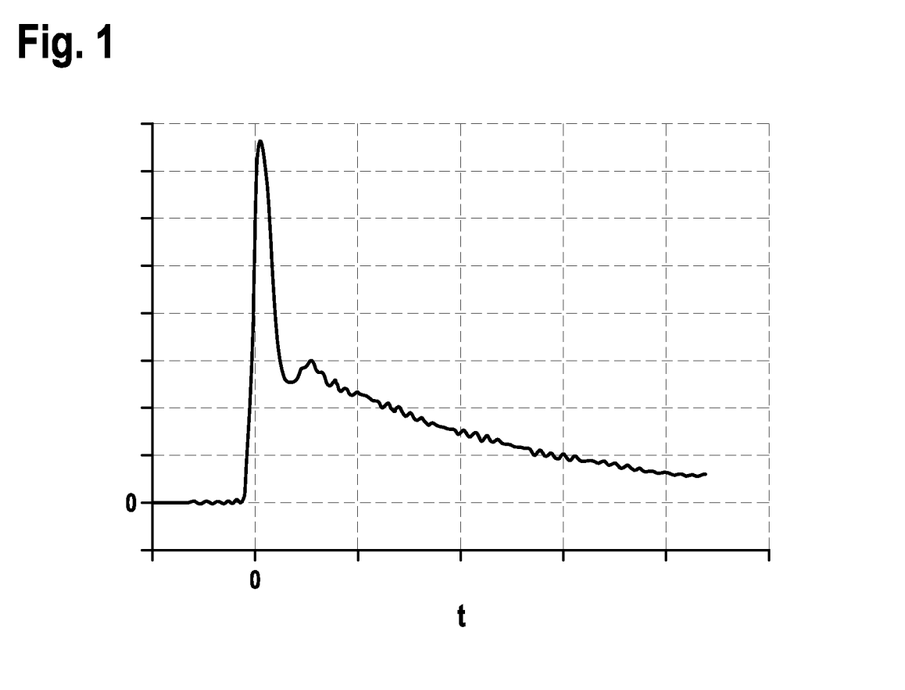
FIG. 1 shows a curve form of a single-photon detector signal.

In an SPM, each detected photon results in an analog pulse, a typical signal profile (intensity over time) being shown in FIG. 1. The pulse form is divided into a rapid rise in the ns to sub-ns range, and a fall in the range of typically 20-100 ns. The signal level is given essentially by the bias voltage above the avalanche breakdown and the capacitance of the individual cell, and of course by amplification factors of the downstream electronics. The rapid rise is a consequence of the breakdown in which the capacitance of the biased diode is discharged to below the breakdown voltage, and the slower fall results from the RC time constants in combination with what is known as the "quenching" resistor. The area under the signal curve corresponds as it were to the charge that was released at the breakdown. An SiPM having dimensions expedient for confocal microscopy (for example 1.3 mm×1.3 mm; 200-1500 individual cells connected in parallel) delivers, with great homogeneity, signals of the same magnitude or the same amount of charge for each cell impinged on by a photon.

In principle, data may be recorded in photomultipliers either in counting mode or in integration mode (also called digital or analog mode).

One possible approach for obtaining a signal proportional to the number of incident photons is that of counting the events by comparing the analog signal with a threshold and increasing a counter each time it is exceeded. As soon as pulses overlap, the measured count rate is however smaller than the actual number of events. With knowledge of existing photon statistics and with a known pulse form of the detection signal, it is possible to draw conclusions about and possibly correct errors. In the case of pulsed excitation, knowledge of the fluorescence lifetime is also necessary for successful correction. That is to say, the correction has to be performed in a sample-dependent manner, which is connected with additional expenditure.

A further possibility for keeping the errors as small as possible when counting pulses is that of bringing the pulses into a form that is as short as possible. This may be performed either by high-pass filtering of the output signal or by way of a capacitive tap between the diode and the quenching resistor, as disclosed for example in US 2013/0099100 A1. The signal level is however thereby reduced.

To detect the impingement of a photon and to record the signals of a single-photon detector with high temporal resolution, in particular in the case of a temporally close sequence of the detected photons, the high-pass-filtered signal may be amplified and then compared with a threshold value. As soon as the threshold value is exceeded, a digital signal that is able to be processed further with high temporal resolution is generated. A passive RC element, that is to say resistor and capacitor with downstream amplifier, may for example be used to couple out the high-pass-filtered signal.

Figure 2A:
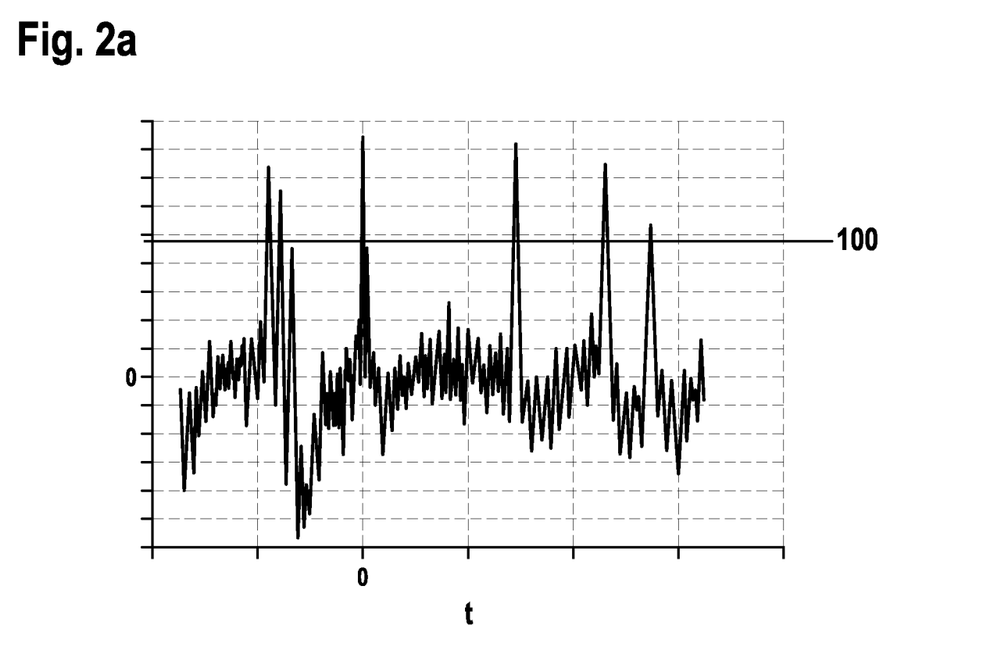
FIG. 2a shows one possible curve profile of a high-pass-filtered detector signal.

This high-pass-filtered signal in this case generally always has voltage components above and below the quiescent position, such that the surfaces above and below the quiescent position are of virtually the same size. The result of this is that, in the case of a plurality of closely consecutive pulses, the level of the pulses depends on how they overlap with preceding pulses. As a result, pulses may either be lost or be counted at the incorrect time or, in the case of reverberation, also be counted too high. FIG. 2a shows one possible curve profile of a high-pass-filtered signal having a plurality of consecutive pulses on a longer timescale than FIG. 1. The threshold value is denoted 100. In the case for example of three closely consecutive pulses, the pulse level possibly drops below the threshold value 100, such that the third pulse is not counted in this example.

Figure 2B:
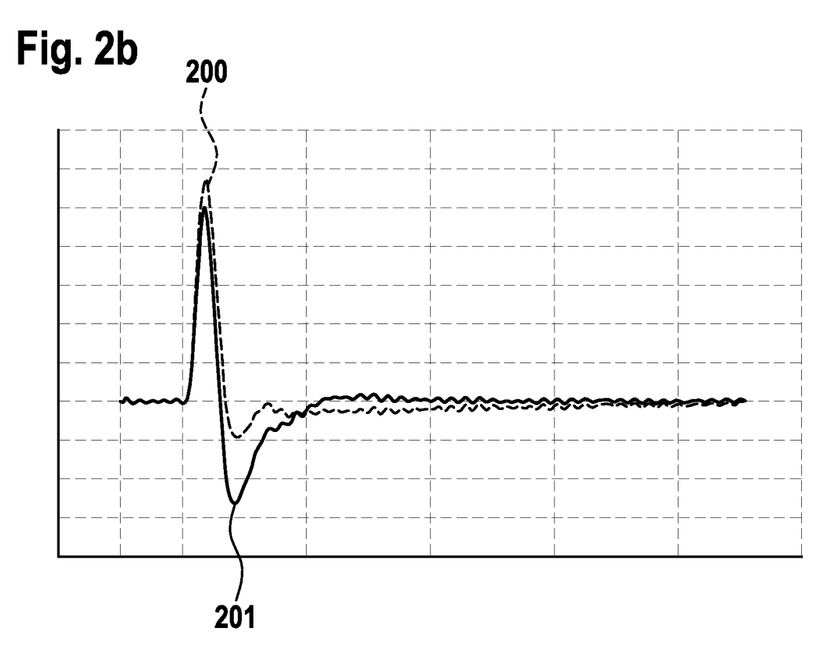
FIG. 2b shows a comparison between an ideally and a really high-pass-filtered signal.

One reason for this phenomenon is inter alia the non-ideal behavior of real filters. In the case of real filters in the frequency range of several MHz, stray inductances and capacitances also play a role, for example, such that usually not just one simple first-order high-pass filter arises. As illustrated in FIG. 2b, a real high-pass-filtered signal 201 corresponds for example to a 2nd-order filter. In contrast to an ideal profile 200, the brief pulse above follows a significant undershoot. If a second pulse overlaps such that the maximum of the second pulse impinges on the minimum of the first pulse, the level of the second pulse is correspondingly distorted.

Another complicating factor is that the signals of an SPM preferred here are usually only of a magnitude of 1-2 mV and are therefore amplified in practice, for example by a factor of 100. In this case, however, each offset is also correspondingly amplified. Although it is then possible to amplify the signal with several amplifier stages, each stage in each case amplifying only the high-pass-filtered signal of the preceding stage so as to keep the offset small, the real behavior with undershoots is thereby encouraged.

It is therefore desirable to reduce or to overcome the disadvantages from the prior art and to record the signals of a single-photon detector with better temporal resolution and higher accuracy.

SUMMARY

In an embodiment, the present invention provides a method for evaluating a single-photon detector signal. The method includes duplicating the single-photon detector signal into a first and a second signal. The first signal is processed and the second signal is either not processed or is processed in a manner different from the first signal. A differential signal is formed between the unprocessed or differently processed second signal and the processed first signal. The differential signal is evaluated to determine pulse events.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following:

FIG. 4a shows a profile of a first processed and of a second unprocessed signal according to one embodiment of the invention;

FIG. 4b shows a profile of the difference between the two signals from FIG. 4a;

DETAILED DESCRIPTION

According to the invention, a method for evaluating a single-photon detector signal, an arrangement, a computer unit, a computer program for performing said method and a storage medium having the features of the independent patent claims are proposed. Advantageous configurations are the subject matter of the dependent claims and of the following description.

The method according to the invention for evaluating a single-photon detector signal is distinguished in that the single-photon detector signal—if desired following preprocessing, in particular amplification, but without high-pass filtering—is duplicated into a first and a second signal, wherein the first signal is processed and the second signal is either not processed or is processed in a manner different from the first signal, a differential signal between the processed or unprocessed second signal and the processed first signal then being formed, wherein the differential signal is evaluated in order to determine pulse events. By way of example, the pulses may be counted and/or times for the pulses may be determined.

The invention is thus based on the concept of replacing conventional high-pass filtering by calculating the difference between differently processed signals.

The invention in particular offers the advantage that, in contrast to high-pass-filtered variants with real filters, there is no or barely any shift of the pulse levels depending on the sequence of the pulses. A further advantage is that existing offsets cancel one another out by virtue of the duplication into two paths and subsequent calculation of a difference only at the end of the amplifier chain.

The evaluation of the differential signal may in principle comprise known methods, for example a threshold value comparison, wherein the differential signal is compared with a threshold value, wherein a pulse event is determined for each exceedance of the threshold value. Instead of counting the single-photon events through comparison with a threshold value, the differential signal may also be integrated over time intervals in order to obtain an integral value proportional to the photon count. This is expedient especially when the individual events occur very close to one another or even at the same time. In the case of counting, events are lost in this case, whereas, in the case of integrating per event, almost identical areas arise under the curve of the differential signal. Integration at high light intensities thus rather delivers a value that is proportional to the light intensity. A threshold value comparison on the other hand delivers better temporal resolution.

In one advantageous embodiment, the processing of the first signal comprises low-pass filtering, preferably with a cutoff frequency between 20 and 100 MHz, particularly preferably between 50 and 80 MHz. Calculating a difference between a low-pass-filtered first signal and an unprocessed second signal gives rise to a high-frequency component which, in contrast to the high-pass-filtered variants with real filters, however does not have any shift of the pulse levels depending on the sequence of the pulses. As mentioned, the single-photon detector signal may be amplified prior to the duplication but is not high-pass-filtered, such that DC voltage components (offsets) are amplified as well. If the signal resulting from the calculation of the difference is then compared with a threshold value, then it is possible to correctly determine all pulse events. The only requirement is that the threshold value is dropped below between two pulses.

In one preferred development of this variant, the processing of the second signal preferably comprises low-pass filtering with a cutoff frequency different from the first signal. Since the cutoff frequency of the low-pass filtering of one signal is higher than the cutoff frequency of the low-pass filtering of the other signal, part of the high-frequency component of the amplified signal is still transmitted and remains after the difference has been calculated. In this meaning, different low-pass filtering and difference calculation operations act as a bandpass.

It is also conceivable for the first signal and/or the second signal to be high-pass-filtered and/or bandpass-filtered in the course of the various processing operations.

The processing of the first signal and/or of the second signal expediently comprises a delay, preferably in order to compensate propagation time differences and/or in order to add a differential component. In particular in cases in which the second signal is not processed, the processing of the first signal results in propagation time differences, which are compensated by delaying the faster signal in a targeted manner prior to the calculation of the difference. Identical times of the processed first signal and of the processed or unprocessed second signal are thereby able to be correlated with one another.

In a further advantageous embodiment, the processing of the first signal and/or of the second signal comprises a sign-dependent and/or rise-dependent processing operation. In the context of a sign-dependent processing operation, each signal value and/or each differential value may in particular be processed depending on the sign. One possible sign-dependent processing operation is that of filtering out negative signal values or setting them to zero. For a rise-dependent processing operation, a local rise may be determined in particular for each signal value and/or each differential value, and the processing operation may be selected depending thereon. One rise-dependent processing operation may be that of allowing only signal sections having a minimum rise or a maximum rise to pass. A high-frequency component of the single-photon signal is thereby in particular able to be filtered out.

It is also conceivable for the processing of the first signal and/or of the second signal to comprise an individual amplification. Various scales are conceivable in this case.

In a further advantageous embodiment, one or more signals in the chain, that is to say detector signal, first signal, second signal (in each case before or after a processing operation), differential signal, are digitized at a high enough sampling rate (that is to say in order still to be able to record a pulse with a rapid component of around 1-2 ns), and the further method steps are performed computationally. This is the case at a sampling rate of at least 2 GHz. This is advantageous since a precise digital calculation thereby becomes possible.

Further advantages and configurations of the invention result from the description and the appended drawings.

It is understood that the features mentioned above and the features yet to be discussed below may be used not only in the respectively specified combination but also in other combinations or individually without departing from the scope of the present invention.

FIG. 1 shows a curve form of a single-photon detector signal. Each detected photon results in a pulse having a rapid component (around 1-2 ns) followed by a slightly slower component (around 30-60 ns). The pulse form is divided into a rapid rise in the ns to sub-ns range, and a fall in the range of typically 30-60 ns. The signal level is given essentially by the bias voltage above the avalanche breakdown and the capacitance of the individual cell, and of course by amplification factors of the downstream electronics. The rapid rise is a consequence of the breakdown in which the capacitance of the biased diode is discharged to below the breakdown voltage, and the slower fall results from the RC time constants in combination with what is known as the "quenching" resistor.

FIG. 2a shows one possible curve profile of a high-pass-filtered single-photon detector signal. To detect the impingement of the photon, the high-pass-filtered single-photon detector signal in the prior art is amplified and then compared with a threshold value. As soon as the threshold value is exceeded, a digital signal that is able to be processed further with high temporal resolution is generated. A capacitor is generally used to couple out the high-frequency component, as already mentioned above. The high-pass-filtered signal in this case always has voltage components above and below the quiescent position, such that the areas above and below the quiescent position are of virtually the same size. The result of this is that, in the case of a plurality of closely consecutive pulses, the level of the pulses depends on how they overlap with preceding pulses. As a result, pulses may either be lost or be counted at the incorrect time or, in the case of reverberation, also be counted too high.

Figure 3:
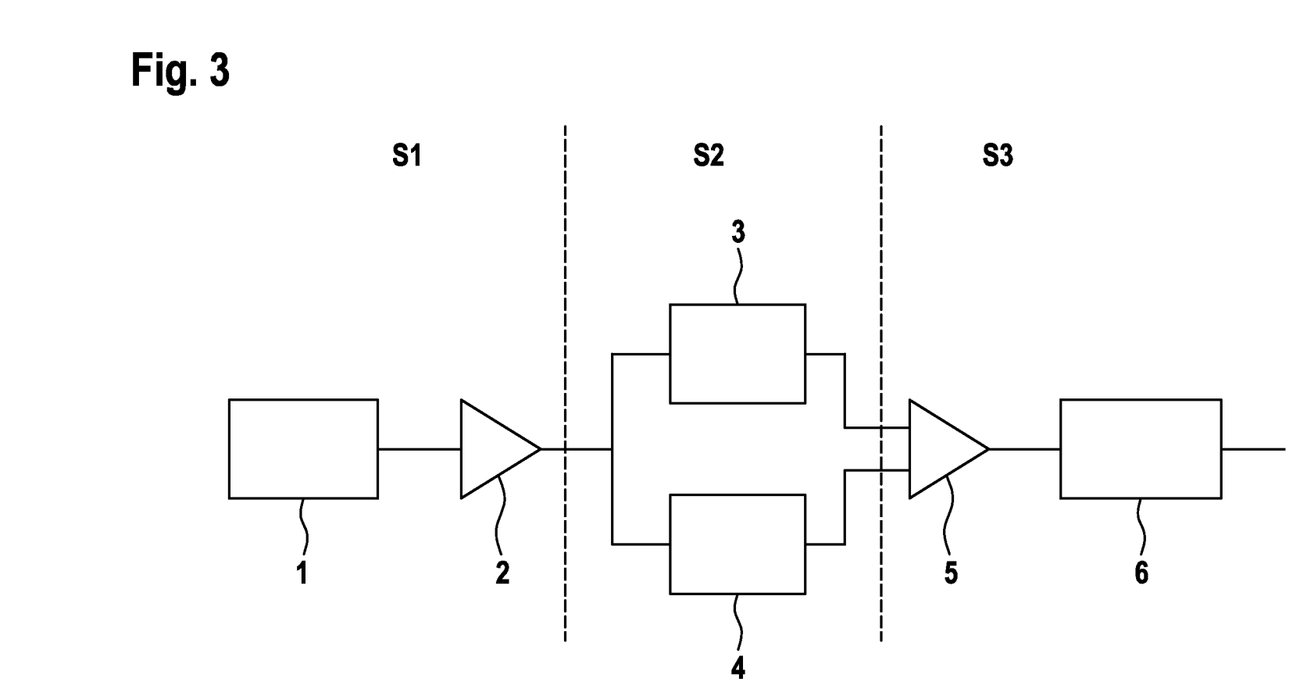
FIG. 3 shows a function-oriented illustration of one embodiment of the method according to the invention.

FIG. 3 shows an arrangement for performing one embodiment of a method according to the invention. In this case, a single-photon detector signal is generated in a detector 1. This signal is first of all forwarded to an amplifier 2 in the present example. The signal is amplified there and duplicated into two signals. The first signal is forwarded to a first processing unit 3 and the second signal is forwarded to a second processing unit 4.

The first signal is processed, preferably low-pass-filtered, in the first processing unit 3. In the second processing unit 4, the second signal is either forwarded in unprocessed form or processed in a manner different from the first signal in the first processing unit 3. The propagation time of the second signal is preferably delayed in the second processing unit 4 in order to compensate a propagation time difference between the first and second signal.

The processed first signal and the processed second signal are then forwarded to a subtractor 5, in which a differential signal between the processed first signal and the unprocessed or processed second signal is formed and forwarded to a processing unit 6.

The differential signal may for example be digitized and then evaluated in the processing unit 6. The differential signal is in particular compared with a threshold value, from which a pulse event, for example a time for a pulse, is determined for each exceedance of the threshold value.

Figure 4:
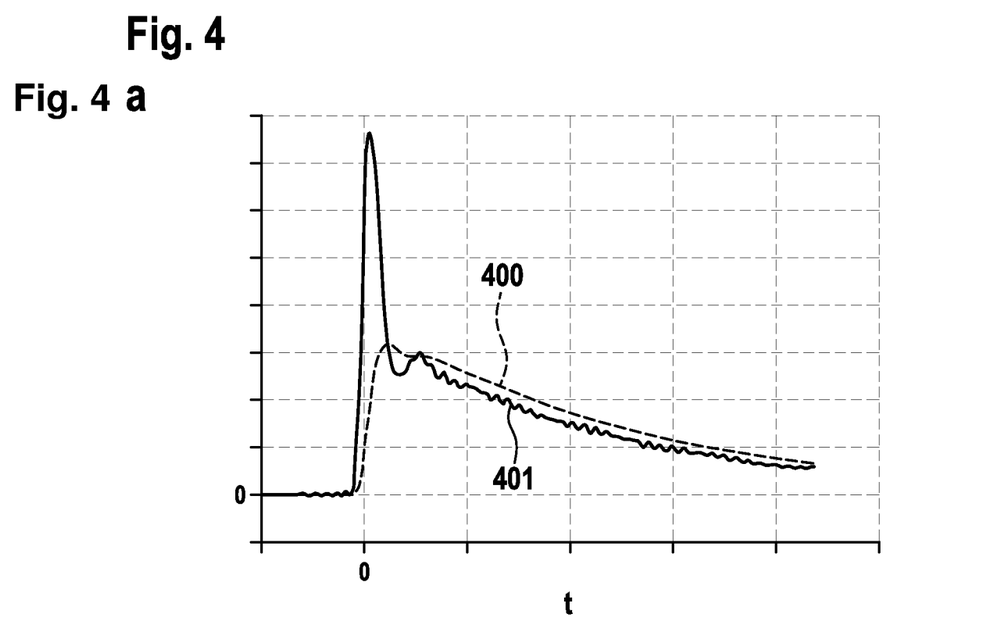

FIG. 4a shows a profile of a first processed and of a second unprocessed signal according to one embodiment of the invention. The unprocessed signal corresponds to the amplified single-photon detector signal. The processed signal has been low-pass-filtered, as a processing step, with a cutoff frequency of 50 MHz. It is able to be seen in the low-pass-filtered signal that the high-frequency component of the rapid pulse rise has been filtered out and no longer appears in the low-pass-filtered signal.

FIG. 4b shows the result of the calculation of the difference between the two signals from FIG. 4a. The result is a stronger pulse that corresponds to the high-frequency component in the case of a rapid rise of the pulse. Smaller oscillations are also able to be seen, these however being of less consequence.

Figure 5:
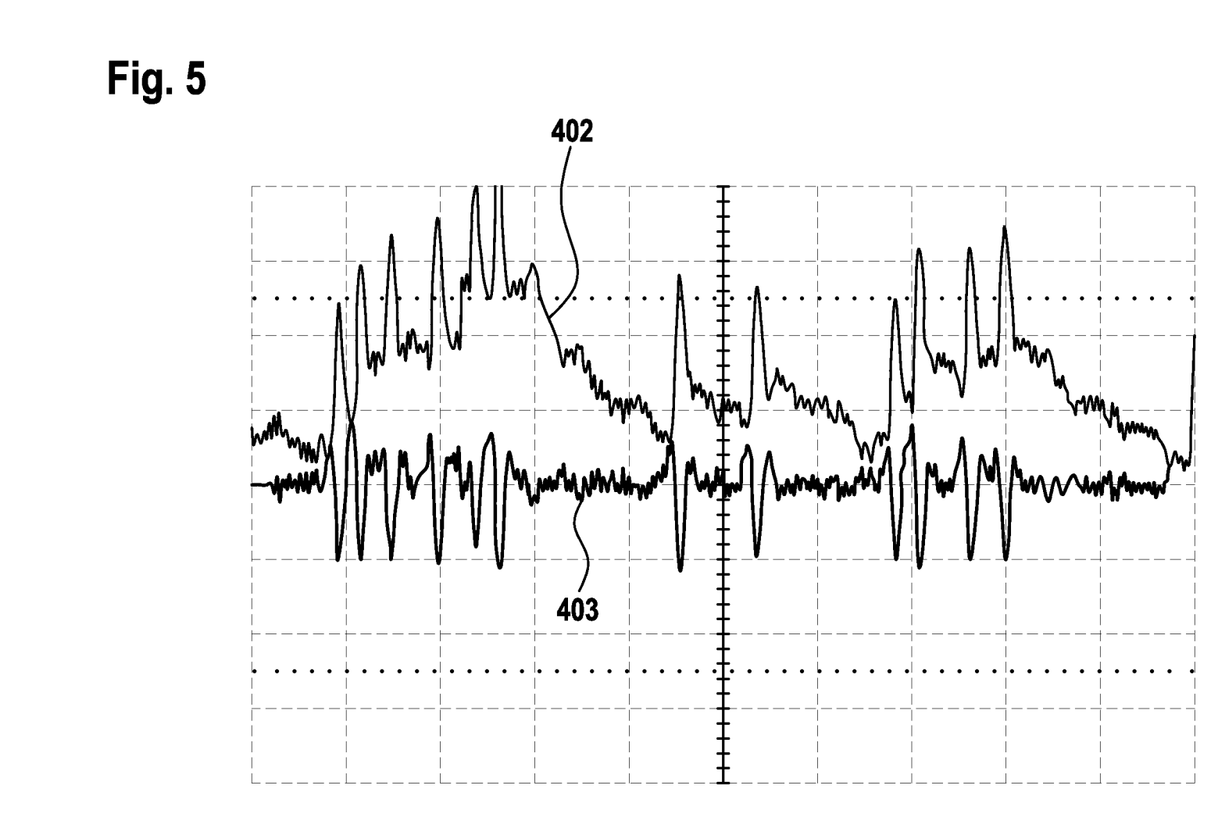
FIG. 5 shows an oscilloscope recording with direct measurement of the single-photon detector signal and with recording following a processing operation according to one embodiment of a method according to the invention.

FIG. 5 shows an oscilloscope recording, wherein the upper curve shows a direct measurement with an amount of light in which the individual pulses are closely consecutive. To arrive at the lower curve, low-pass filtering with a cutoff frequency of 80 MHz was first of all performed by way of calculation in the oscilloscope, and the upper curve was then subtracted therefrom. The remaining pulses are then of virtually the same level, independently of the history.

Figure 6:
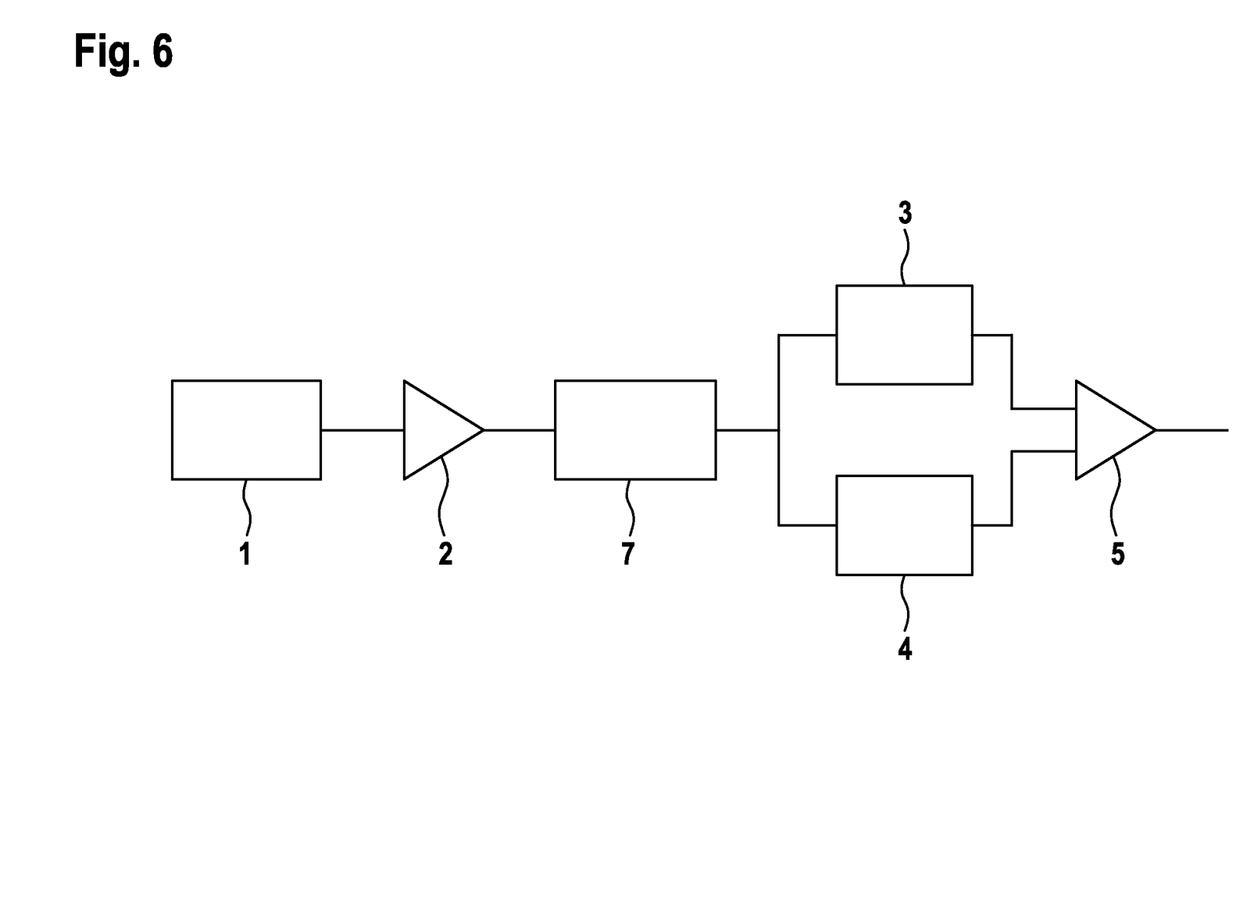
FIG. 6 shows a function-oriented illustration of a further embodiment of the method according to the invention.

FIG. 6 shows an alternative arrangement for performing one embodiment of a method according to the invention. In this case, a single-photon detector signal is generated in a detector 1. This signal is forwarded to an amplifier 2. The signal is amplified there and forwarded to a digitization unit 7. The amplified signal is digitized there at a sampling rate of at least 2 GHz. The further steps may then be performed computationally. It is therefore understood that the units described below may be present in particular in the form of software.

The digitized signal is in particular duplicated into two signals, wherein the first signal is forwarded to a first processing unit 3 and the second signal is forwarded to a second processing unit 4. The first signal is processed, preferably low-pass-filtered, in the first processing unit 3 and, in the second processing unit 4, the second signal is either forwarded in unprocessed form or processed in a manner different from the first signal in the first processing unit 3. The propagation time of the second signal is preferably delayed in the second processing unit 4 in order to compensate a propagation time difference between the first and second signal.

The processed first signal and the processed or unprocessed second signal are then forwarded to a subtractor 5, in which a differential signal between the processed first signal and the unprocessed or processed second signal is formed and forwarded to a processing unit. The differential signal is evaluated in the processing unit, wherein the profile of the difference is in particular compared with a threshold value, wherein a time for a pulse is determined for each exceedance of the threshold value.

Figure 7:
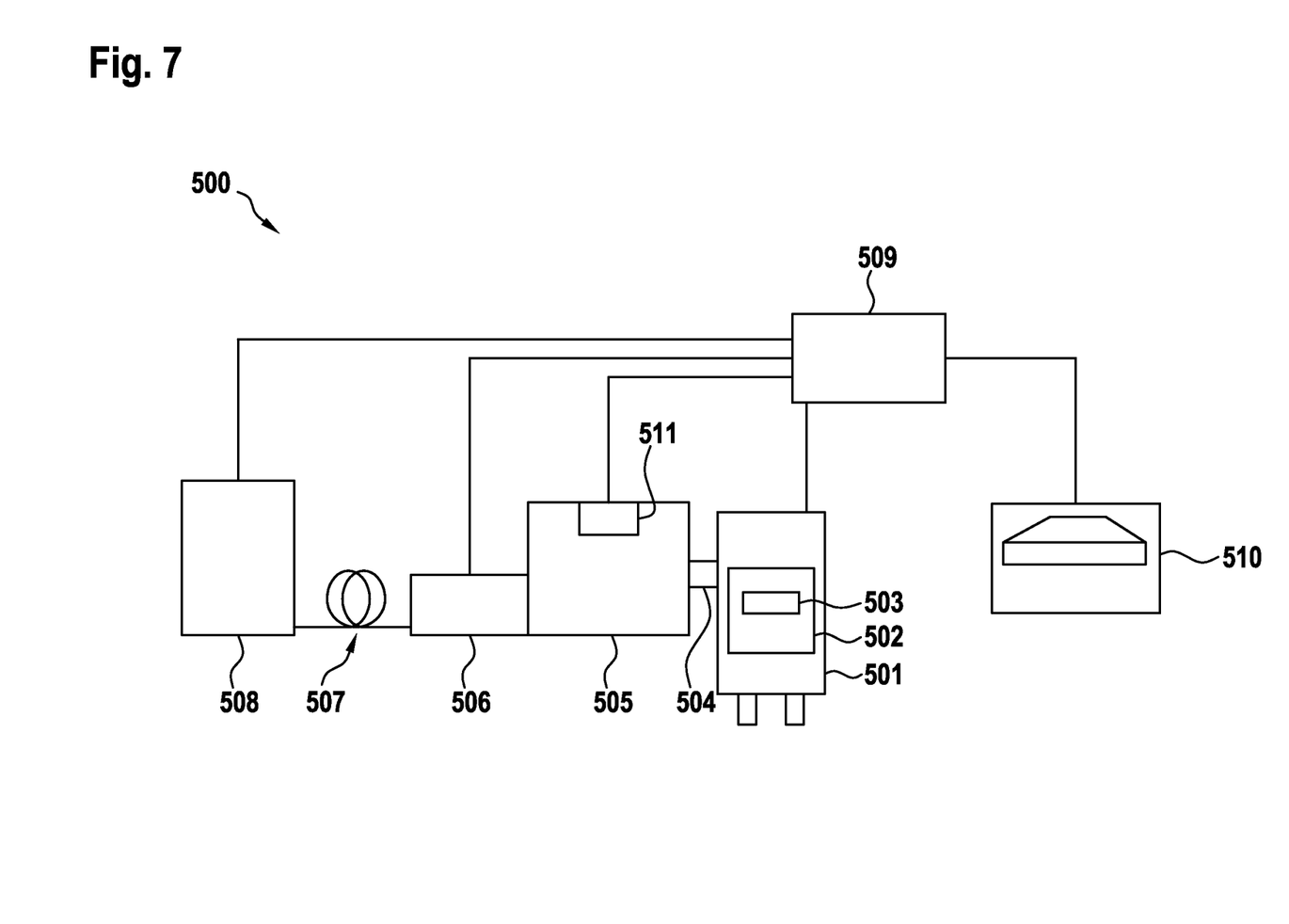
FIG. 7 shows an overview of the typical elements of a confocal microscope in a schematic view.

FIG. 7 schematically shows a confocal microscope having typical components. 500 denotes the overall system. The confocal scanning and detection unit is denoted 505. The associated illumination apparatus is denoted 506. 508 is a laser light source that is connected to the illumination apparatus 506 by way of an illumination fiber 507. 504 denotes an optical adapter for the confocal scanning and detection unit 505 on the microscope stand 501. Part of the stand 501 is an object table 502 having a sample 503 to be investigated. A computer unit, designed as control unit 509, of an arrangement according to the invention is connected to the individual components 508, 506, 505 and 501 by way of corresponding connection lines. A computer containing control and display programs is denoted 510; it is also connected to the control unit 509.

The sample 503 to be investigated is illuminated by way of microscope optics and is imaged in particular onto a sensor arrangement 511 of an arrangement according to the invention by way of the same microscope optics, which arrangement consists, depending on the embodiment of the confocal scanning and detection unit 505, of a photomultiplier or an array of photomultipliers.

A conventional confocal beam path is arranged within the confocal scanning and detection unit 505 in a first variant, which beam path, as is known, is constructed by way of an individual pinhole and a beam scanner, for example a mirror scanner.

In a second variant, the confocal scanning and detection unit 505 contains a beam path, in the case of which the sample is illuminated at the same time by one or more illumination points or illumination points extended in one direction. The photons to be detected are accordingly selected for example by way of a geometric arrangement of pinholes. The sensor arrangement 511 then consists of an array of photomultipliers.

In the second variant of the overall system, which variant comprises a microscope having a sensor array, the individual photomultipliers, in particular SiPM, are arranged either linearly or in the form of a two-dimensional photomultiplier matrix, these being evaluated according to one preferred embodiment of the invention.

The first variant of the overall system has a conventional confocal beam path (as described above) within the confocal scanning and detection unit 505. In this case, the imaged beam is imaged onto a single photomultiplier, in particular an SiPM, which is evaluated according to one preferred embodiment of the invention.

The operation of a system 500 illustrated in FIG. 7 is well known per se and is therefore not intended to be explained here.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE SIGNS

1 detector
2 amplifier
3 first processing unit
4 second processing unit
5 subtractor
6 processing unit
7 digitization unit
100 threshold value
500 confocal microscope
501 stand
502 object table
503 sample
504 optical adapter
505 scanning and detection unit
506 illumination apparatus
507 illumination fiber
508 laser light source
509 control unit
510 computer
511 sensor arrangement

What is claimed is:

1. A method for evaluating a single-photon detector signal, the method comprising:
   duplicating the single-photon detector signal into a first and a second signal, wherein the first signal is processed and the second signal is either not processed or is processed in a manner different from the first signal;
   forming a differential signal between the unprocessed or differently processed second signal and the processed first signal; and
   evaluating the differential signal to determine pulse events,
   wherein the single-photon detector signal, the first and second signal or the differential signal are digitized at a sampling rate of at least 2 GHz.

2. The method as claimed in claim 1, wherein the processing of the first signal comprises low-pass filtering.

3. The method as claimed in claim 2, wherein the low-pass filtering is performed with a cutoff frequency between 20 MHz and 100 MHz.

4. The method as claimed in claim 2, wherein the low-pass filtering is performed with a cutoff frequency between 50 MHz and 80 MHz.

5. The method as claimed in claim 2, wherein the second signal is processed, and wherein the processing of the second signal comprises low-pass filtering with a cutoff frequency different from the first signal.

6. The method as claimed in claim 1, wherein the processing of the first signal and/or of the second signal comprises a delay.

7. The method as claimed in claim 6, wherein the processing of the first signal and/or of the second signal is performed so as to compensate propagation time differences and/or to add a differential component.

8. The method as claimed in claim 1, wherein the processing of the first signal and/or of the second signal comprises a sign-dependent and/or rise-dependent processing operation.

9. The method as claimed in claim 1, wherein the processing of the first signal and/or of the second signal comprises an individual amplification.

10. The method as claimed in claim 1, wherein the single-photon detector signal is amplified before the first and second signal are formed.

11. The method as claimed in claim 1, wherein the single-photon detector signal is not high-pass filtered before the first and second signal are formed.

12. The method as claimed in claim 1, wherein the evaluation comprises comparing the differential signal with a threshold value, wherein a pulse event is determined for each exceedance of the threshold value.

13. The method as claimed in claim 1, wherein the evaluation comprises integrating the differential signal, wherein a number of pulse events is determined from the integral value.

14. A computer unit that is configured to perform the method as claimed in claim 1.

15. An arrangement for evaluating a single-photon detector signal, the arrangement comprising a detector, an amplifier, a subtractor and at least one processing unit, wherein the arrangement is configured to perform the method as claimed in claim 1.

16. The arrangement according to claim 15, wherein the at least one processing unit includes first and second processing units for processing the first and second signals, respectively, and a third processing unit for processing the differential signal.

17. A non-transitory computer-readable medium having instructions thereon which, upon being executed by a computer unit, cause the computer unit to perform the method as claimed in claim 1.

18. A microscope system, confocal microscope system or scanning confocal microscope system having at least one photomultiplier and a computer unit configured to perform a method for evaluating a single-photon detector signal, the method comprising:
    duplicating the single-photon detector signal into a first and a second signal, wherein the first signal is processed and the second signal is either not processed or is processed in a manner different from the first signal;
    forming a differential signal between the unprocessed or differently processed second signal and the processed first signal; and
    evaluating the differential signal to determine pulse events.

19. A microscope system, confocal microscope system or scanning confocal microscope system having an arrangement comprising a detector, an amplifier, a subtractor and at least one processing unit, wherein the arrangement is configured to perform a method for evaluating a single-photon detector signal, the method comprising:
    duplicating the single-photon detector signal into a first and a second signal, wherein the first signal is processed and the second signal is either not processed or is processed in a manner different from the first signal;
    forming a differential signal between the unprocessed or differently processed second signal and the processed first signal; and
    evaluating the differential signal to determine pulse events.

20. A method for evaluating a single-photon detector signal, the method comprising:
    duplicating the single-photon detector signal into a first and a second signal, wherein the first signal is processed and the second signal is either not processed or is processed in a manner different from the first signal, wherein the processing of the first signal and/or of the second signal comprises an individual amplification;
    forming a differential signal between the unprocessed or differently processed second signal and the processed first signal; and
    evaluating the differential signal to determine pulse events.

21. A method for evaluating a single-photon detector signal, the method comprising:
    duplicating the single-photon detector signal into a first and a second signal, wherein the first signal is processed and the second signal is either not processed or is processed in a manner different from the first signal;
    forming a differential signal between the unprocessed or differently processed second signal and the processed first signal; and
    evaluating the differential signal to determine pulse events, wherein the evaluation comprises comparing the differential signal with a threshold value, and wherein a pulse event is determined for each exceedance of the threshold value.

22. A method for evaluating a single-photon detector signal, the method comprising:
    duplicating the single-photon detector signal into a first and a second signal, wherein the first signal is processed and the second signal is either not processed or is processed in a manner different from the first signal;
    forming a differential signal between the unprocessed or differently processed second signal and the processed first signal; and
    evaluating the differential signal to determine pulse events, wherein the evaluation comprises integrating the differential signal, and wherein a number of pulse events is determined from the integral value.

23. A method for evaluating a single-photon detector signal, the method comprising:
    duplicating the single-photon detector signal into a first and a second signal, wherein the first signal is processed and the second signal is either not processed or is processed in a manner different from the first signal, wherein the processing of the first signal comprises low-pass filtering;
    forming a differential signal between the unprocessed or differently processed second signal and the processed first signal; and
    evaluating the differential signal to determine pulse events.

* * * * *